United States Patent [19]

Hawrylo et al.

[11] Patent Number: 4,612,211

[45] Date of Patent: Sep. 16, 1986

[54] SELECTIVE SEMICONDUCTOR COATING AND PROTECTIVE MASK THEREFOR

[75] Inventors: Frank Z. Hawrylo, Hamilton Township, Mercer County; Henry V. Kowger, deceased, late of Jamesburg, both of N.J., by Dorothy J. Kowger, executrix

[73] Assignee: RCA Corporation, Princeton, N.J.

[21] Appl. No.: 563,627

[22] Filed: Dec. 20, 1983

[51] Int. Cl.$^4$ ............................................. B05D 5/12
[52] U.S. Cl. ................................. 427/86; 430/317; 430/327; 430/524; 430/531
[58] Field of Search ...................... 427/86, 87, 88, 93, 427/82, 83, 154, 156; 430/317, 318, 327, 524, 531

[56] References Cited

U.S. PATENT DOCUMENTS

| | | |
|---|---|---|
| 2,445,253 | 7/1948 | Verhoek et al. |
| 3,701,047 | 10/1972 | Caplan et al. |
| 4,022,928 | 5/1977 | Piwcyzk |
| 4,092,659 | 5/1978 | Ettenberg |
| 4,178,564 | 12/1979 | Ladany et al. |
| 4,200,463 | 4/1980 | Flowers ............................ 430/524 |
| 4,201,592 | 5/1980 | Doi et al. |

Primary Examiner—Donald P. Walsh
Attorney, Agent, or Firm—B. E. Morris; D. S. Cohen; H. R. Ball

[57] ABSTRACT

An improved method of selectively depositing coatings onto bodies of semiconductor material employs as a protective mask an alkyl ester of a sulfosuccinate salt. The mask material is applied to areas which are to be kept free of the coatings. The overspray of a desired coating, onto the protective mask is deposited in a cracked, non-continuous manner, as opposed to the smooth crystalline layer being deposited over the semiconductor body. This overspray coating can be readily removed.

8 Claims, 10 Drawing Figures

SELECTIVE SEMICONDUCTOR COATING AND PROTECTIVE MASK THEREFOR

This invention relates to a method of selective coating of a substrate which method employs a protective mask. More particularly, the invention relates to a protective mask used to apply facet coatings to semiconductor electroluminescent devices.

BACKGROUND OF THE INVENTION

In the manufacture of semiconductor electroluminescent devices, such as lasers and light emitting diodes, it is known to apply one or more layers of light reflective material to at least one of the radiation emitting facets of the device. These facet coatings, which can be of $Al_2O_3$, $Si$, $SiO_2$, $Si_3N_4$, $MgF_2$ and the like, can enhance the radiant energy emitted by the device and decrease the current density required for lasing to occur by increasing, or varying in a controlled manner, the reflectivity of the facets. Facet coatings can also increase the lifetime of a laser device by providing protection against catastrophic facet degradation and/or facet erosion.

During the fabrication of laser devices a processed semiconductor wafer is typically cleaved into bars whose width corresponds to the desired width of the devices. The appropriate facet coatings are applied to the bars for ease of handling before dividing into devices. The top and bottom surfaces of the bar should be masked because an "overspray" of the facet coatings onto these surfaces adversely affects the mechanical, thermal and electrical properties of the subsequent solder joint or bond which holds each device to its heatsink mount. The bars can be mounted in fixtures designed to mask the top and bottom surfaces of the bar, exposing only the facets to the facet coating process which is carried out by any convenient means, such as electron beam evaporation. Typically the top surface of the bar is butted against a flat surface on the inside of the fixture so that no deposition of the facet coatings can occur on this top surface. A slot or window in the fixture exposes only as much of the facet of the bar as is necessary. The ability of the fixture to prevent an overspray of the facet coating onto the top surface relies heavily on an intimate contact of the top surface with the inside of the fixture. Thus the top surface of the bar must be planar for proper masking.

However, because the structural layers of the laser are deposited by liquid phase epitaxy (LPE), or the like, the "grown" surface is usually somewhat non-planar. Further, it is well known to process the device so as to include an oxide defined stripe contact which introduces additional non-planarities. Finally, many recent devices are fabricated by growing layers over intentionally non-planar substrates. Thus, fixtures used to mask a grown surface during facet coating cannot be made to conform to the non-planarities, and overspray of the particular facet coatings onto the grown surface still occurs.

Various mask coatings including waxes, photoresists and varnishes have been applied to the grown surface of a processed wafer prior to cleaving it into bars. Although the overspray is prevented from depositing directly onto the grown surface, it does deposit over the masking coating. In many cases, upon removing the masking material with solvents, the overspray still remains. This is especially true when a plurality of facet coatings have been deposited leaving a thick overspray. Attempts to physically remove this hinge of overspray usually results in tearing away part of the facet coating from the facet. Chemical etches are obviously not a solution because whatever attacks the overspray, will also attack the facet coating itself.

It would be desirable therefore to have a method of selectively applying a coating to a body of semiconductor material which alleviates the problem of overspray onto surfaces which are to be kept free of the coating.

SUMMARY OF THE INVENTION

An improved method of depositing coatings onto bodies of semiconductor material employs as a protective mask an alkyl ester of a sulfosuccinate salt. The mask material is applied to areas which are to be kept free of the coatings. The overspray of a desired coating, onto the protective mask is deposited in a cracked, non-continuous manner, as opposed to the smooth crystalline layer being deposited over the semiconductor body. This overspray coating can be readily removed.

DETAILED DESCRIPTION OF THE INVENTION

The improved selective coating process of the present invention employs a protective mask comprising an alkyl ester of a sulfosuccinate salt having the formula

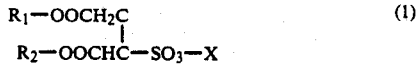

where X is a metal selected from the group consisting of sodium, potassium, calcium and magnesium and wherein $R_1$ and $R_2$ are alkyl groups which can be different or the same. The selective coating process of the present invention has been found to be very useful in the semiconductor facet coating art and will now be described in that regard by referring to the FIGURES.

Figure 1:
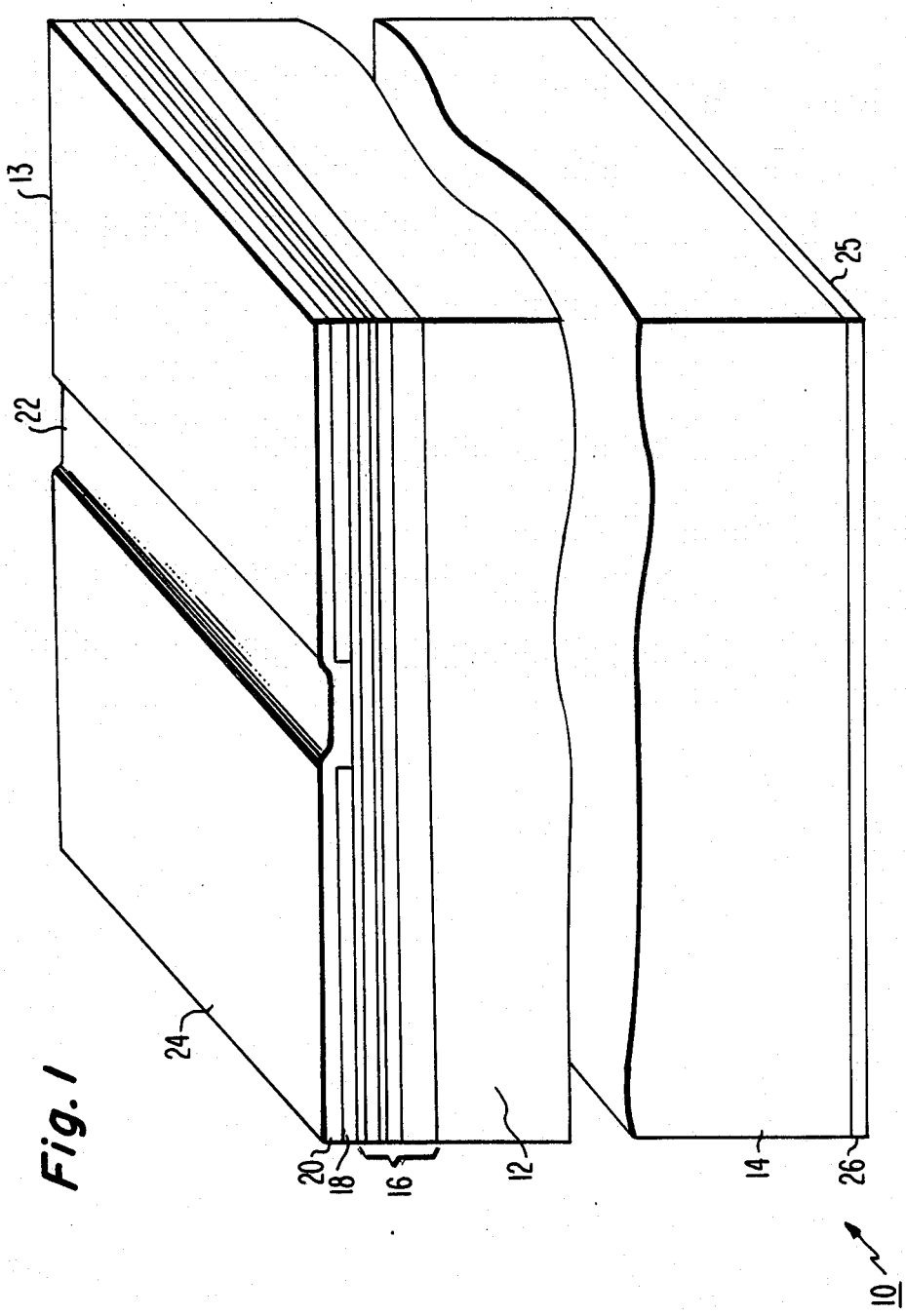
FIG. 1 illustrates a laser diode of a type to which coatings are applied.

FIG. 1 illustrates a semiconductor device of a type to which facet coatings are applied, generally as 10. One or more reflective coatings (not shown) can be applied to the emitting facet(s) 12 and/or 13 as required. The device 10 comprises a substrate 14 and an epitaxially grown plurality of layers 16. An oxide defined stripe contact 22 overlies the grown layers 16 and comprises a patterned insulating layer 18 and a contact metallization layer 20 including one or more metal layers, as is known in the art. The upper surface can be referred to as the "grown" surface 24 because it substantially conforms with the grown layers 16 which may be somewhat non-planar due to growth defects, lattice mismatch, and the like. Opposed to grown surface 24 is the substrate surface 25 which typically is coated with a metal contact 26. Although sizes vary, typical dimensions for the device 10 of FIG. 1 are about 300 micrometers ($\mu$m) across the emitting facet 12 by about 150 $\mu$m from emitting facet 12 to emitting facet 13 by about 100 $\mu$m from the grown surface 24 to the substrate surface 25. The grown layers 16 typically comprise only the upper 5-10 $\mu$m of the device 10 so it becomes important that facet coatings applied to the emitting facet(s) 12 and/or 13 extend all the way to the grown surface 24.

Figure 2:
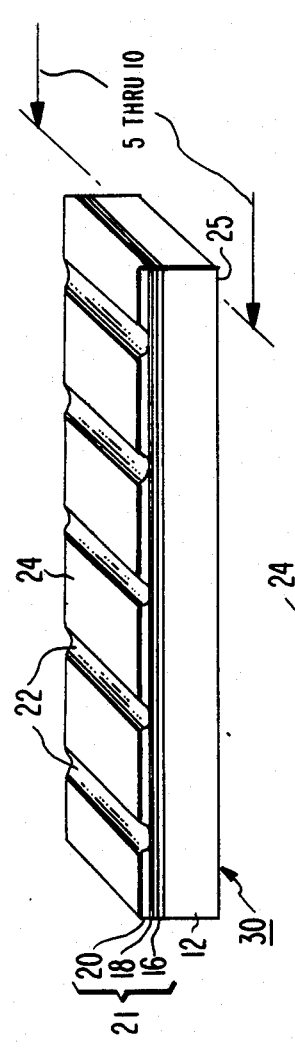
FIG. 2 illustrates a bar of semiconductor material which is to be facet coated.

FIG. 2 shows a bar 30 which has been cleaved from a larger processed wafer and which comprises a plurality of devices like the device 10 of FIG. 1. This is usually the stage of processing when facet coatings are deposited on the emitting facet 12. The grown layers 16, the insulating layer 18 and metal contact layer 20 make up the area on the facet 12 near the surface 24 which will be referred to as the emitting region 21 where facet coating coverage is crucial.

It can be seen in FIGS. 1 and 2, however, that the stripe contacts 22 represent non-planar areas of the grown surface 24.

Figure 3:
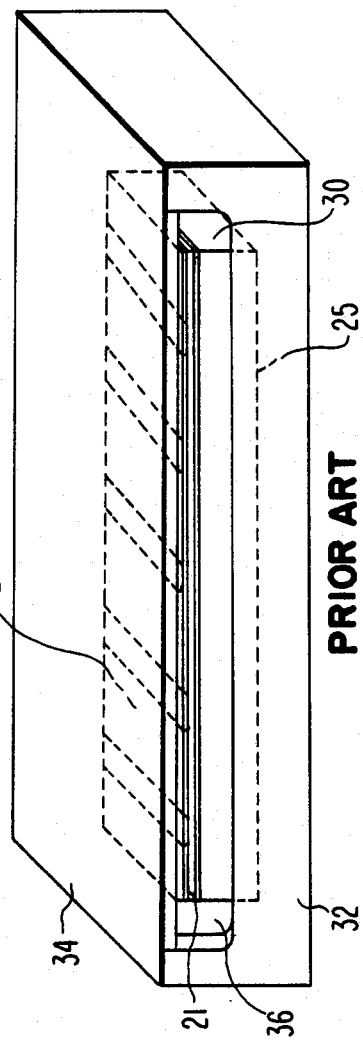
FIG. 3 illustrates a fixture used to mask a semiconductor bar in a prior art method.

FIG. 3 in accordance with the prior art shows a fixture 32 for holding and masking a bar 30 during the facet coating process. The fixture 32 is a boxlike structure with a large flat wall 34. The grown surface 24 of the bar 30 is held in intimate contact with the inside of the flat wall 34 so as to mask the surface 24. A window 36 exposes that part of the facet 12 to be coated. In this case, only a portion of the facet 12 is exposed because the facet coating is required primarily over the emitting region 21.

Figure 4:
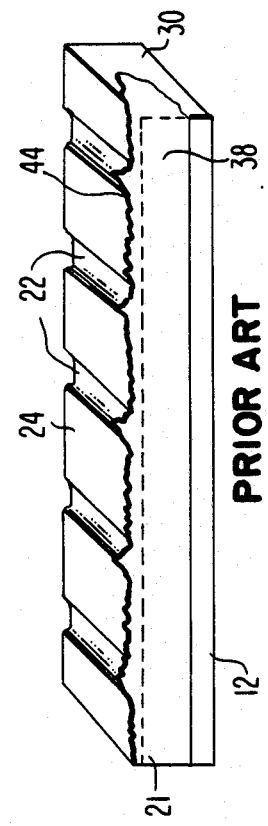
FIG. 4 illustrates a typical "oversprayed" bar coated according to a prior art method.
Figure 5:
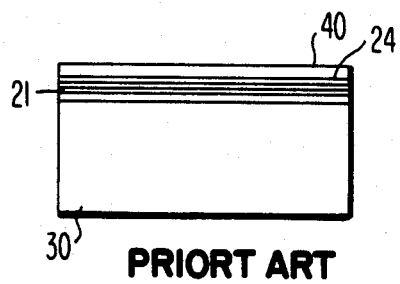
FIG. 5 is an end view of the bar of FIG. 2 with a prior art masking coating on the "grown" surface.

In FIG. 4 a typical result of the prior art facet coating process is depicted on the bar 30. Because of the stripe contacts 22 and inherent non-planarities from the crystal growth of the grown surface 24, the surface 24 cannot be held flush with the flat wall 34 of the fixture 32 of FIG. 3. It can be seen that the coating 38 covers the emitting region 21 of the facet 12 but has also oversprayed onto the grown surface 24. The overspray 44 is typically present on part of the surface 24 as well as in the stripe contacts 22.

FIGS. 5-8 in accordance with the prior art show the sequence of a bar 30 which is facet coated in a process which utilizes the fixture 32 of FIG. 3 in conjunction with a prior art mask 40. These FIGURES represent an end view of the bar in FIG. 2. The mask 40 has typically been a wax, emulsion coating, resin, or varnish, usually soluble in organic solvents for subsequent removal.

Figure 7:
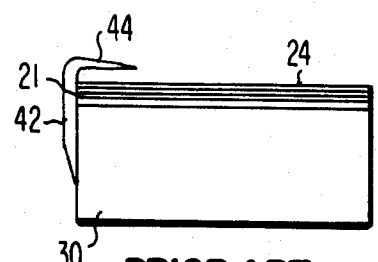
FIG. 7 illustrates the prior art facet coated bar of FIG. 6 after the prior art mask has been removed.
Figure 6:
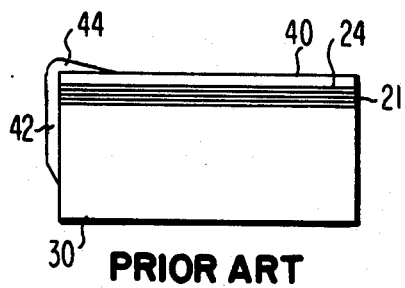
FIG. 6 shows the bar of FIG. 5 after the facet coatings have been applied in accordance with a prior art method.

FIG. 6 illustrates a prior art mask 40 wherein the facet coating 42 extends over the mask 40 as illustrated by the overspray 44. The overspray 44 is a smooth and tenacious extension of the facet coating 42 and usually remains intact, as shown in FIG. 7, after removal of the mask 40. The overspray 44 of FIG. 7 cannot be tolerated in subsequent processing and FIG. 8 illustrates the damage done to the facet coating 42 upon attempts to physically or mechanically remove the overspray 44.

Figure 8:
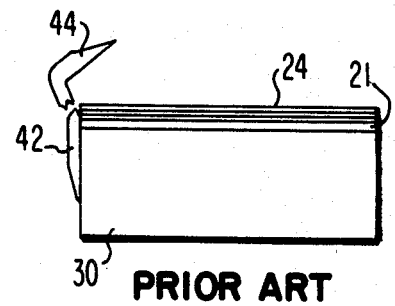
FIG. 8 illustrates the prior art facet coated bar of FIG. 7 after the overspray of reflective coating has been physically removed.

FIG. 8 shows part of the facet coating 42 being torn away from the emitting region 21 and, as previously discussed, because the emitting region 21 is typically only about 5-10 micrometers or less from the grown surface 24, even the slightest amount of tearing away of the facet coating 42 is undesirable. Further, attempts at mechanical removal of the overspray 44 can result in damage to the sensitive contacts on the grown surface 24.

Figure 9:
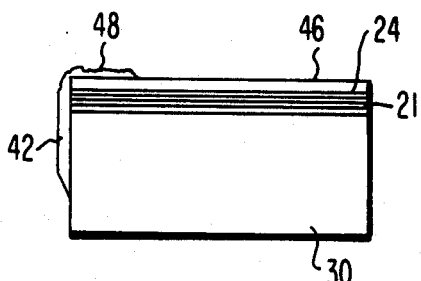
FIG. 9 illustrates the end of a semiconductor bar which has a protective mask according to the present invention.
Figure 10:
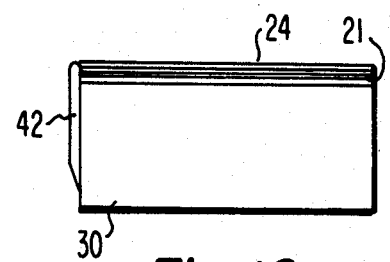
FIG. 10 illustrates the end of the bar of FIG. 9 after the protective mask of the present invention has been removed.

FIGS. 9 and 10, in accordance with the present invention, illustrate the simple, accurate facet coating provided by the present selective coating process employing a novel protective mask which may be used in conjunction with a prior art fixture. In FIG. 9, wherein the surface 24 has been coated with the protective mask 46 of the present invention, it can be seen that while a smooth, crystalline facet coating 42 covers the emitting region 21, surprisingly a cracked, non-continuous overspray 48 overlies the improved mask 46. This cracked, non-continuous overspray 48 is substantially removed upon simple dissolution of the improved mask 46, leaving the resultant bar 30 of FIG. 10 with a totally intact facet coating 42 and a clean grown surface 24. The selective coating method of the present invention obviates the need for typically detrimental attempts at physically removing any overspray. Further, certain of the masking materials of the present invention are soluble in water as well as in organic solvents.

One such material is dioctyl sodium sulfosuccinate (DSS) which is commercially available and has the chemical formula

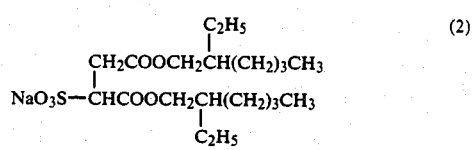

(2)

Therefore, a masking material of the present invention can be put into solution with an organic solvent which will evaporate rapidly when applied to the surface of a semiconductor wafer by techniques known in the art, such as by spin coating. The spin coated wafer can be lightly baked to assure proper setting of the protective mask. After the desired coatings have been deposited, the protective mask of the present invention can be dissolved in an organic solvent to remove the mask and overspray. Alternatively, if one of the water soluble masks of the present invention is used, such as DSS, the mask and overspray can be removed with water to eliminate the problem of organic solvent residue on the semiconductor material.

As a practical matter, the thickness of the improved protective metallization mask should be sufficient to prevent any unwanted coating on the grown surface of the wafer, but thin enough to allow cleaving of the wafer into bars. Typically, a thickness of about 1-15 $\mu$m should suffice for these purposes, a preferred range being 5-10 $\mu$m.

Alkyl esters of sulfosuccinate salts are known for their use as wetting agents in industrial, pharmaceutical, cosmetic and food applications. However, their use as a protective mask in a selective coating process, and more specifically the application to the semiconductor facet coating art, has not been disclosed heretofore.

The present invention will be further described by the following example, however it should be noted that the scope of the present invention is not meant to be limited to the details described therein.

EXAMPLE I

Ten cubic centimeters (cc) of commercially available dioctyl sodium sulfosuccinate (DSS), comprising 75 percent by volume DSS in water was added to 90 cc of isopropyl alcohol and designated SOLUTION A. To 2 cc of FREON TF was added about 5 drops of SOLUTION A to make SOLUTION B. SOLUTION B was spin coated onto the grown, stripe-contacted surface of a semiconductor wafer suitable for dicing into laser devices. To expedite evaporation of the solvents in the coating, the coated wafer was baked in air at about 150° C. for 30 minutes. The resultant coating of dioctyl sodium sulfosuccinate (DSS) was about 10 micrometers ($\mu$m) thick The wafer was cleaved into bars whose width corresponded to the desired width of the laser devices into which it was to be subsequently divided. Each bar was placed in a fixture which masked substantially all of the bar except for the emitting region of one of the emitting facets. A standard facet coating comprising alternating contiguous layers of $Al_2O_3$ and Si was deposited by electron beam evaporation to a total thickness of about 6000Å onto the emitting region of the emitting facet. A cracked, non-continuous overspray of the facet coating onto the DSS masked surface was observed after the facet coating process. The bars were rinsed several times in warm deionized water which removed the DSS protective mask and the facet coating overspray.

What is claimed is:

1. In a method of selectively coating a portion of a body of semiconductor material which method comprises applying a protective mask to portions of the body;
depositing one or more coating layers onto the exposed areas of the body; and
removing the protective mask from the body;

the improvement comprising employing as said protective mask an alkyl ester of a sulfosuccinate salt having the formula

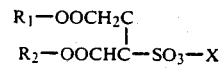

where X is a metal selected from the group consisting of sodium, potassium, calcium and magnesium and wherein $R_1$ and $R_2$ are alkyl groups and can be the same or different.

2. The method of claim 1 wherein $R_1$ and $R_2$ are alkyl groups of 4-12 carbon atoms and can be the same or different.

3. The method of claim 1 wherein the protective mask is dioctyl sodium sulfosuccinate having the formula

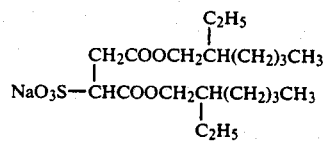

4. The method of claim 1 wherein the body of semiconductor material is a light emitting device with emitting facets.

5. The method of claim 4 wherein the facet coatings are selected from the group consisting of $Al_2O_3$, Si, $SiO_2$, $Si_3N_4$, and $MgF_2$.

6. The method of claim 4 wherein the coating comprises alternating layers of $Al_2O_3$ and Si.

7. The method of claim 1 wherein the protective mask is from about 1-15 micrometers in thickness.

8. The method of claim 5 wherein the protective mask is preferably from about 5-10 micrometers in thickness.

* * * * *